United States Patent
Iwamoto et al.

(10) Patent No.: US 6,856,404 B2
(45) Date of Patent: Feb. 15, 2005

(54) SCANNING EXPOSURE METHOD AND APPARATUS, AND DEVICE MANUFACTURING METHOD USING THE SAME

(75) Inventors: Kazunori Iwamoto, Utsunomiya (JP); Nobuyoshi Deguchi, Tochigi-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 42 days.

(21) Appl. No.: 09/323,034

(22) Filed: Jun. 1, 1999

(65) Prior Publication Data

US 2003/0151748 A1 Aug. 14, 2003

(30) Foreign Application Priority Data

Jun. 2, 1998 (JP) .......................................... 10-167805

(51) Int. Cl.$^7$ ............................................... G01B 9/02
(52) U.S. Cl. ....................................... 356/500; 356/508
(58) Field of Search ......................... 356/500, 508–509, 356/401, 490, 492, 498; 250/548

(56) References Cited

U.S. PATENT DOCUMENTS

| | | | | |
|---|---|---|---|---|
| RE33,836 E | * | 3/1992 | Resor, III et al. ............. | 355/43 |
| 5,151,749 A | * | 9/1992 | Tanimoto et al. ........... | 356/620 |
| 5,523,843 A | * | 6/1996 | Yamane et al. ............. | 356/363 |
| 5,646,413 A | * | 7/1997 | Nishi .......................... | 250/548 |
| 5,907,392 A | * | 5/1999 | Makinouchi ................. | 355/53 |
| 5,969,800 A | * | 10/1999 | Makinouchi ................. | 355/53 |
| 6,097,495 A | * | 8/2000 | Uzawa et al. ............... | 356/401 |
| 6,160,619 A | * | 12/2000 | Magome ..................... | 356/358 |

* cited by examiner

Primary Examiner—Samuel A. Turner
Assistant Examiner—Michael A. Lyons
(74) Attorney, Agent, or Firm—Fitzpatrick, Cella, Harper & Scinto

(57) ABSTRACT

A scan type exposure for transferring a pattern onto a substrate by scan exposure. The apparatus includes a stage for moving the substrate in a Y direction corresponding to a scan direction, and in an X direction intersecting the scan direction, an alignment scope for performing measurement for alignment of the substrate, at a position spaced, in the Y direction, from a position where the exposure of the substrate is to be carried out, an X measuring device for performing yaw measurement of said stage by use of an X reflection surface provided on said stage along the Y direction, a Y measuring device for performing yaw measurement of the stage by use of a Y reflection surface provided on the stage along the X direction, and a controller being operable to select yaw measurement information of the X measuring device for an alignment operation including the alignment measurement using the alignment scope, and being operable to select yaw measurement information of the Y measuring device for the scan exposure.

10 Claims, 4 Drawing Sheets

SCANNING EXPOSURE METHOD AND APPARATUS, AND DEVICE MANUFACTURING METHOD USING THE SAME

FIELD OF THE INVENTION AND RELATED ART

This invention relates generally to an exposure apparatus usable in a lithographic process, for example, for a semiconductor device or liquid crystal device. More particularly, the invention is concerned with a scan type exposure apparatus wherein a pattern formed on an original is transferred to a substrate to be exposed by relatively moving the original and the substrate relative to a projection optical system.

Exposure apparatuses for use in the manufacture of semiconductor devices, for example, are currently represented by a step-and-repeat type exposure apparatus (stepper) wherein a substrate (wafer or glass plate) to be exposed is moved stepwise so that a pattern of an original (reticle or mask) is printed on different exposure regions on the substrate in sequence and by sequential exposures with the use of a projection optical system, and a step-and-scan type exposure apparatus (scan type exposure apparatus) wherein, through repetitions of stepwise motion and scanning exposure, lithographic transfer is repeated to different regions on a substrate. Particularly, in scan type exposure apparatuses, since only a portion of a projection optical system close to its optical axis is used with restriction by a slit, higher precision and wider picture-angle exposure of a fine pattern can be accomplished. It will, therefore, become the main stream.

In conventional scan type exposure apparatuses, usually, a global alignment procedure is made by using an off-axis alignment scope which is disposed in a scan axis direction as viewed from the optical axis of a projection optical system and, after moving a wafer to an exposure start point below the projection optical system (along the scan axis direction), stepwise motion and scanning exposure in regard to a next shot are repeated. In the movement or scanning motion of the wafer, laser interferometers are used to measure the position y of a wafer stage in the scan axis direction (hereinafter, Y direction) and the position x with respect to a direction (hereinafter, X direction) along a horizontal plane and being perpendicular to the scan axis direction as well as rotation θ (yawing) around a vertical axis (hereinafter, Z axis). On the basis of measured data, the wafer stage is servo-controlled. Usually, the yawing measurement for this servo-control is performed only with respect to a single direction, i.e., the scan axis direction.

SUMMARY OF THE INVENTION

The inventors of the subject application have found that: the yawing measurement data will theoretically be the same, regardless that the measurement is made with respect to the X direction or Y direction; comparing the results when yawing measurement in a scan type exposure apparatus is made with respect to the X direction and when it is made with respect to the Y direction, synchronization precision during scan is deteriorated when the yawing measurement is made with respect to the X direction while overlay precision based on alignment precision in superposed printing is deteriorated when the yawing measurement is made with respect to the Y direction, both as compared with a case when the stage servo control is made on the basis of the yawing measured value, measured with respect to the other direction, i.e., the Y direction or X direction.

It is an object of the present invention to improve the performance of a scan type exposure apparatus such as synchronization precision in scan or overlay precision in superposed printing.

In accordance with an aspect of the present invention, there is provided a scan type exposure apparatus, wherein a pattern is transferred sequentially to different regions of a substrate through a step-and-scan operation including a combination of stepwise motion of the substrate to an original and scanning exposure, moving the original and the substrate in a Y direction, said apparatus comprising: a stage for carrying a substrate thereon and being movable in the Y direction and an X direction orthogonal thereto; first measuring means for measuring yawing of said stage by using a first reflection surface along the Y direction of a mirror mounted on said stage; and second measuring means for measuring yawing of said stage by using a second reflection surface along the X direction of a mirror mounted on said stage.

In one preferred form of this aspect of the present invention, said first and second measuring means include laser interferometers for projecting laser beams to the same reflection surface and for performing interference measurement based on reflected laser beams. One of the laser interferometers may be used in the first measuring means as an X-direction laser interferometer for measuring the stage position with respect to the X direction, and also used in the second measuring means as a Y-direction laser interferometer for measuring the stage position with respect to the Y direction.

The stage movement may be servo controlled in accordance with the yawing measurement through the first or second measuring means. The first and second measuring means may be selectively used in accordance with the state of operation of the exposure apparatus. For example, for scanning exposure in which scan is made in the Y direction, the stage position measurement may be made by use of a Y-direction laser interferometer, a Y yawing measurement interferometer and an X-direction laser interferometer. Namely, for the scanning exposure, the second measuring means may be used for the yawing measurement. An alignment scope for performing an off-axis alignment measurement to the substrate may be used and, on that occasion, for the movement after the measurement by the alignment scope, the yawing measurement may be performed by use of the measuring means which is related to a direction orthogonal to the movement direction. Namely, when the measurement position of the alignment scope upon the stage is placed in the Y direction as viewed from the optical axis of the projection optical system, for the movement after measurement by the alignment scope, the yawing measurement may be performed by use of the first measuring means, whereas when the measurement position of the alignment scope is placed in the X direction as viewed from the optical axis of the projection optical system, the yawing measurement may be performed by use of the second measuring means.

For the selective operation of the first and second measuring means, while they may be selectively operated in accordance with the state of operation of the exposure apparatus as described above, one of the measurement data of them may be made effective. Alternatively, the measurement data of the first and second measuring means may be used through averaging processing or statistical processing.

In accordance with another aspect of the present invention, there is provided a scanning exposure method, comprising the steps of: preparing an original and a substrate; measuring a position of the substrate by use of an alignment scope and, after the measurement, moving the substrate; and sequentially transferring a pattern of the original to different regions on the substrate in accordance with a step-and-scan operation including a combination of stepwise motion of the substrate relative to the original and scanning exposure while moving the original and the substrate; wherein, between the scanning exposure and the movement after measurement by the alignment scope, a measurement direction with respect to which yawing measurement to a stage using a laser interferometer is made different. For example, for the scanning exposure, the stage yawing measurement may be performed by projecting laser beams in a direction the same as the scanning movement direction, while, for movement after the measurement by the alignment scope, the stage yawing measurement may be performed by projecting laser beams in a direction orthogonal to the movement direction.

In accordance with a further aspect of the present invention, there is provided a scanning exposure method, comprising the steps of: preparing an original and a substrate; measuring a position of the substrate by use of an alignment scope and, after the measurement, moving the substrate; and sequentially transferring a pattern of the original to different regions on the substrate in accordance with a step-and-scan operation including a combination of stepwise motion of the substrate relative to the original and scanning exposure while moving the original and the substrate; wherein, for the scanning exposure, yawing measurement to a stage is performed by using a laser interferometer and in relation to a direction the same as the scanning movement direction, and wherein, for the movement after measurement by the alignment scope, yawing measurement to the stage is performed by using a laser interferometer and in relation to a direction orthogonal to the movement direction.

The inventors of the subject application have found that, in a scan type exposure apparatus, the flatness and orthogonality of bar mirrors for interferometer measurements have the following influences:

(1) When stage servo control is made with respect to the yawing direction on the basis of an interferometer having a measurement axis orthogonal to the scan axis, the flatness of a bar mirror leads to stage external disturbance, causing degradation of synchronization precision during the scan.

(2) When automatic global alignment (AGA) is performed by use of an off-axis alignment scope which is positioned in the scan axis direction as viewed from a projection optical system, as in conventional systems, and when stage servo control is made in the yawing direction on the basis of an interferometer in the same direction as the scan axis, a change in orthogonality of bar mirrors between the AGA operation and the scanning exposure operation will cause degradation of overlay precision. This is because of a shift corresponding to the baseline (distance between the alignment scope position and the optical axis of the projection optical system) as multiplied by the change in orthogonality (sin Δθ).

In accordance with the present invention, there are yawing measuring means in relation to both of X and Y directions, and they may be used selectively in accordance with the state of operation of the exposure apparatus. This enables significant improvements of various performances, such as overlay precision and synchronization precision.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
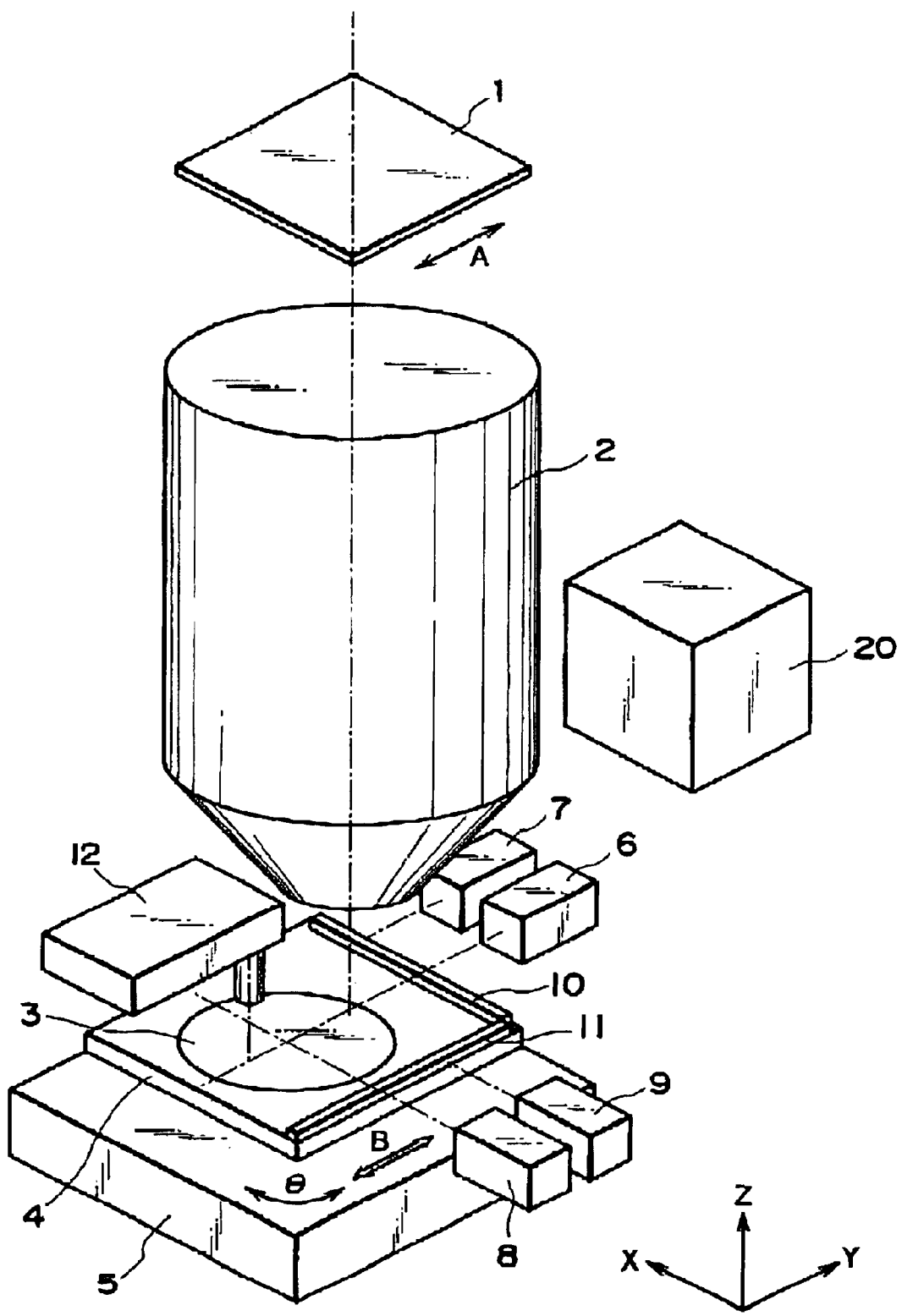
FIG. 1 is a perspective view of a scan type exposure apparatus according to an embodiment of the present invention.

FIG. 1 shows a scan type exposure apparatus according to an embodiment of the present invention. Denoted in the drawing at 1 is a reticle, and denoted at 3 is a wafer. Denoted at 2 is a projection optical system for projecting a pattern of the reticle 1 onto the wafer 3. Denoted at 4 is wafer stage for performing X-Y drive and tilt drive of the wafer 3, and denoted at 5 is a stage base on which the wafer stage 4 is mounted. Denoted at 6 is a Y-direction laser interferometer for measuring the position y in the Y direction (Y coordinate) of the wafer 3 by using a laser beam related to the Y direction. Denoted at 7 is a Y yawing measurement interferometer (second yawing measuring means) for detecting any rotation (yawing) θy about the Z axis as the wafer stage 4 moves, in cooperation with the Y-direction laser interferometer 6 and by using the Y-direction laser beam. Denoted at 8 is an X-direction laser interferometer for measuring an X-coordinate x of the wafer 3 by use of a laser beam related to the X direction. Denoted at 9 is an X yawing measurement interferometer (first yawing measuring means) for detecting any rotation (yawing) θx about the Z axis as the wafer stage 4 moves, in cooperation with the X-direction laser interferometer 8 and by using the X-direction laser beam.

Denoted at 10 is a Y bar mirror having a second reflection surface along the X direction, for reflecting laser beams from the Y-direction laser interferometer 6 and the Y yawing measurement interferometer 7. Denoted at 11 is an X bar mirror having a first reflection surface along the Y direction, for reflecting laser beams from the X-direction laser interferometer 8 and the X yawing measurement interferometer 9. These two bar mirrors 10 and 11 may be provided by a single mirror member with orthogonal reflection surfaces (having the function of X and Y bar mirrors), without separating them. Denoted at 12 is an off-axis alignment scope for performing off-axis wafer alignment. Denoted at 20 is a control unit for controlling various units of this embodiment as described above, and the control unit is communicated with these units via communication lines, not shown. The control unit 20 may be provided by a computer controlled system. Various functions of this embodiment may be performed in accordance with programs stored in the control unit 20. Denoted at A is the scan direction of the reticle 1 for the scanning exposure operation. Denoted at B is the scan direction of the water 3. Denoted at θ is the yawing direction of the stage 4. Idealistically, there is a relation θy=0=θx.

In the exposure apparatus illustrated, the alignment scope 12 is disposed in the scan direction (Y direction) of the projection optical system 2 and, as compared with conventional scan type exposure apparatuses wherein the yawing measurement to the stage 4 is performed in the scan axis direction and by using the Y-direction laser interferometer 6 and the Y yawing measurement interferometer 7, there is an X yawing measurement interferometer 9 added, which is operable to perform yawing measurement to the stage 4 in the X direction in cooperation with the X-direction laser interferometer 8. During the scan exposure operation, as conventional, the yawing measurement is performed in the Y direction by using the laser interferometers 6 and 7, whereas for the global alignment (AGA) operation, it is performed in the X direction by using the laser interferometers 8 and 9. The two laser interferometer systems are selectively used in this manner.

Thus, during a scan operation, the Y bar mirror 10 functions to perform yawing measurement approximately at a constant position. Thus, there is little influence of the flatness of the bar mirror, and the synchronization precision is not degraded. For the global alignment operation, there is little influence of the orthogonality of the X bar mirror 11 to the Y bar mirror 10 and, therefore, the overlay precision is improved as compared with that of conventional scan type exposure apparatuses.

Further, in the exposure apparatus of FIG. 1, in the states of operation other than the alignment operation or scanning operation, measurement may be performed on the basis of a side more convenient to the state of operation being done, or the yawing measured data more convenient may be used selectively. As a further alternative, both of the measured data may be used on the basis of averaging processing or through statistical processing. The measuring means may be used selectively, in this manner.

Figure 2:
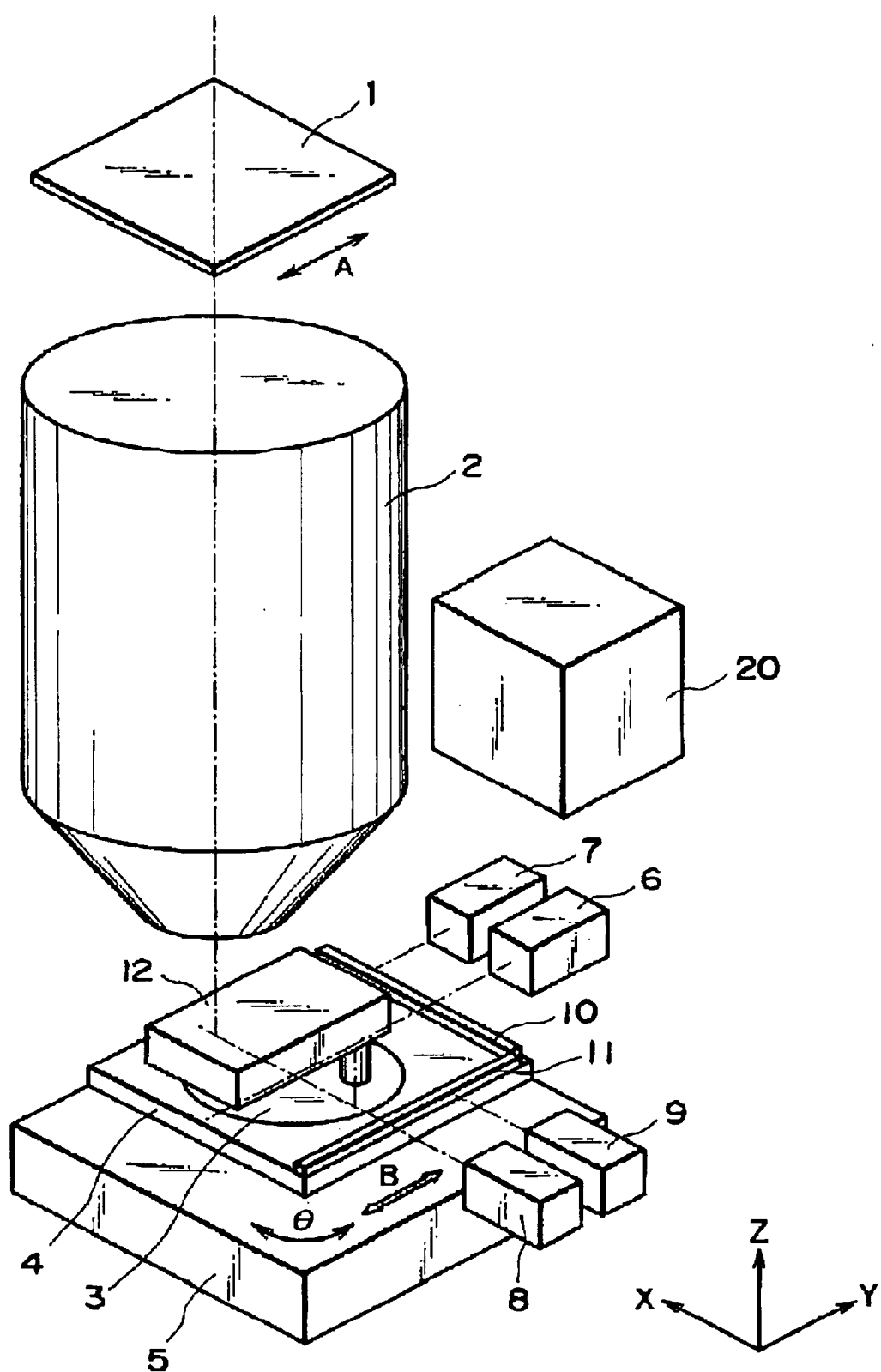
FIG. 2 is a perspective view of a scan type exposure apparatus according to another embodiment of the present invention.

FIG. 2 shows a scan type exposure apparatus according to another embodiment of the present invention. Those components corresponding to those of the FIG. 1 embodiment are denoted by like numerals. In the exposure apparatus of FIG. 2, as compared with conventional apparatuses described above, the position of the alignment scope 12 with respect to the projection optical system 2 is placed in the X direction (FIG. 2), this being contrasted to the Y direction in the conventional structure. With this arrangement, the movement direction in the alignment direction is laid on an X direction which is orthogonal to the scan axis direction (Y direction). Even though the same laser interferometers 6 and 7 are used for yawing measurement in the Y direction, the yawing measurement direction (Y direction) in an alignment operation is preferably laid on a direction orthogonal to the movement direction (X direction). As a result, without degradation of the synchronization precision, the overlay precision can be improved.

In the exposure apparatus of FIG. 2, there is an X yawing measurement interferometer 9 added, for performing yawing measurement to the stage 4 in the X direction, in cooperation with the X-direction laser interferometer 8. In accordance with the state of operation other than the alignment operation or scan operation, the yawing data measured with respect to the direction convenient may be selected or the measurement may be switched. Alternatively, both of the yawing measured data may be used through averaging processing or statistical processing.

Next, an embodiment of a device manufacturing method which uses an exposure apparatus as described above, will be explained.

Figure 3:
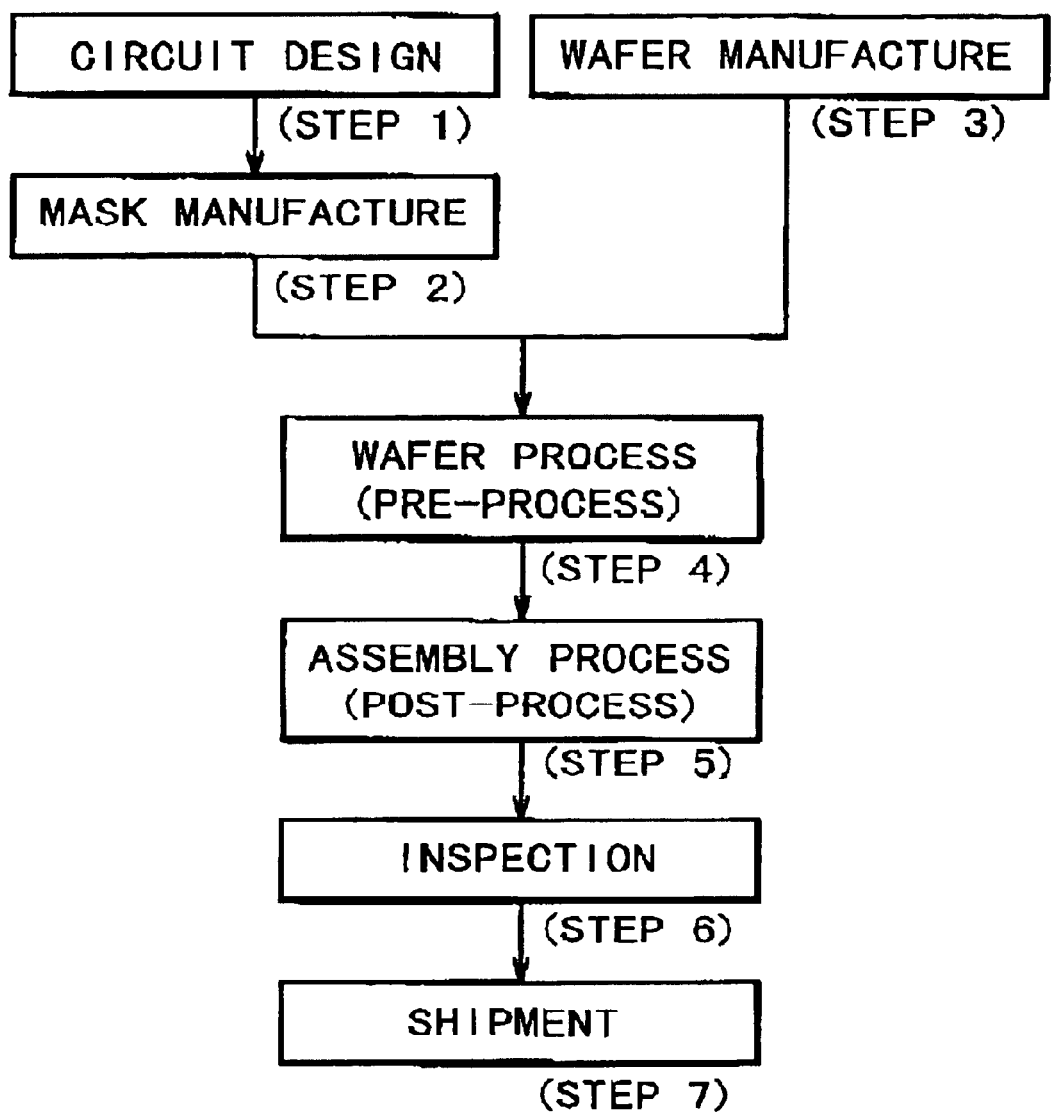
FIG. 3 is a flow chart for explaining microdevice manufacturing processes.

FIG. 3 is a flow chart of a procedure for the manufacture of microdevices such as semiconductor chips (e.g., ICs or LSIs), liquid crystal panels, CCDs, thin film magnetic heads or micro-machines, for example.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 4:
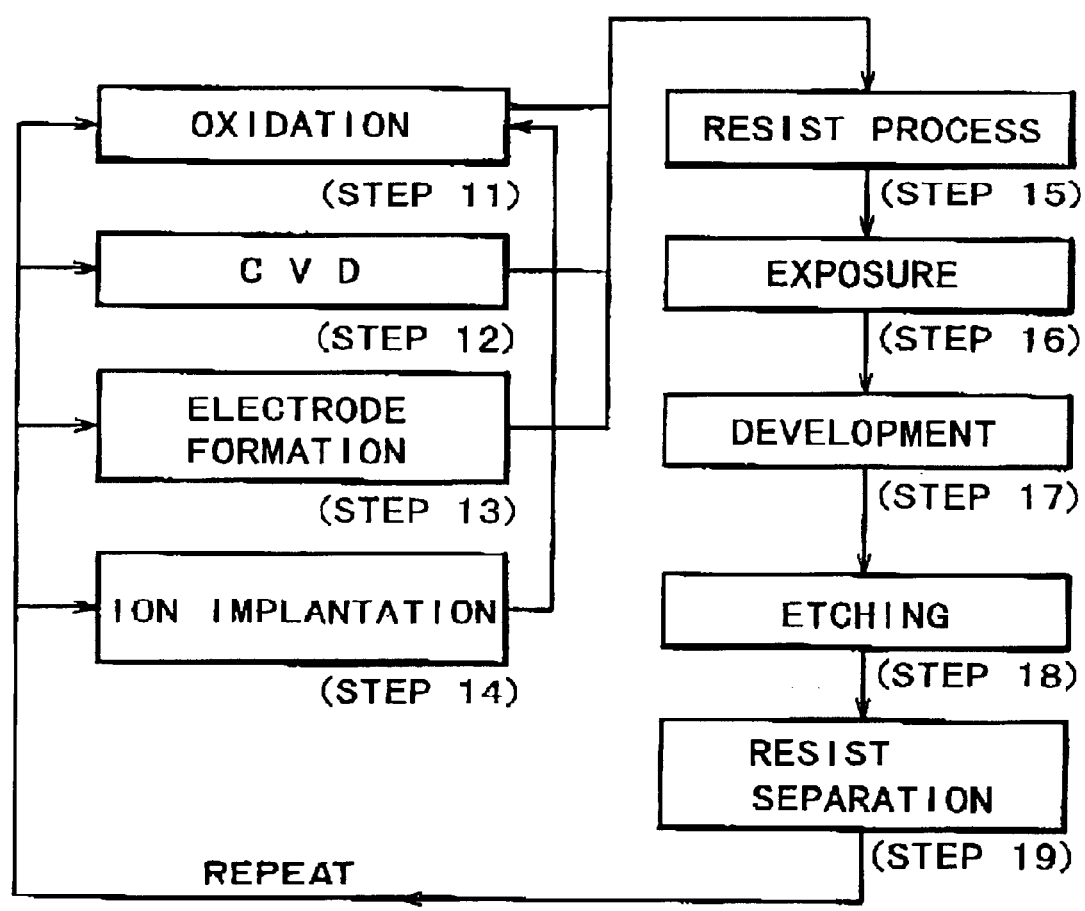
FIG. 4 is a flow chart for explaining a wafer process included in the procedure of FIG. 3.

FIG. 4 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process.

By repeating these processes, circuit patterns are superposedly formed on the wafer. With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. A scan the exposure apparatus for transferring a pattern onto a substrate by scan exposure, said apparatus comprising:

a stage for moving the substrate in a Y direction corresponding to a scan direction, and in an X direction intersecting the scan direction;

an alignment scope for performing measurement for alignment of the substrate, at a position spaced, in the Y direction, from a position where the exposure of the substrate is to be carried out, said alignment scope being disposed on a straight line parallel to a Y-axis and passing through the position for exposure of the substrate;

an X measuring device for performing yaw measurement of said stage by use of an X reflection surface provided on said stage along the Y direction;

a Y measuring device for performing yaw measurement of said stage by use of a Y reflection surface provided on said stage along the X direction; and a controller which selects yaw measurement information of said X measuring device for an alignment operation including the alignment measurement using said alignment scope, and which selects yaw measurement information of said Y measuring device for the scan exposure.

2. An apparatus according to claim 1, wherein said X measuring device includes (i) an X-direction interferometer for measuring a position of said stage in the X direction and (ii) an X yaw interferometer cooperating with said X-direction interferometer to measure yawing of said stage, and said Y measuring device includes (i) a Y-direction interferometer for measuring a position of said stage in the Y direction and (ii) a Y yaw interferometer cooperating with said Y-direction interferometer for measuring yawing of said stage.

3. An apparatus according to claim 2, wherein said X-direction interferometer and said X yaw interferometer are arranged to use a light beam reflected by said Y reflection surface, and said Y-direction interferometer and said Y yaw interferometer are arranged to use a light beam reflected by said X reflection surface.

4. An apparatus according to claim 3, wherein, in the scan exposure, said controller performs position control of said stage, on the basis of said Y-direction interferometer, said Y yaw interferometer, and said X-direction interferometer.

5. An apparatus according to claim 1, wherein said controller performs an averaging processing or a statistical processing to yaw measurement data obtained by said X measuring device and said Y measuring device when an alignment operation and a scan exposure operation are not carried out.

6. An apparatus according to claim 1, wherein said controller performs yaw measurement using said X measuring device, when said stage is to be moved after the alignment measurement using said alignment scope.

7. A scan type exposure apparatus for transferring a pattern onto a substrate by scan exposure, said apparatus comprising:
   a stage for moving the substrate in a Y direction corresponding to a scan direction, and in an X direction intersecting the scan direction;
   an alignment scope for performing measurement for alignment of the substrate, at a position spaced, in the X direction, from a position where the exposure of the substrate is to be carried out, said alignment scope being disposed on a straight line parallel to an X-axis and passing through the position for exposure of the substrate;
   a Y measuring device for performing yaw measurement of said stage by use of a Y reflection surface provided on said stage along the X direction, said Y measuring device including (i) a Y-direction interferometer for measuring a position of said stage in the Y direction, and (ii) a Y yaw interferometer being cooperable with said Y-direction interferometer to measure yawing of said stage; and
   a controller which selects yaw measurement information of said Y measuring device, both for an alignment measurement using said alignment scope and for the scan exposure operation.

8. An apparatus according to claim 7, further comprising an X measuring device for performing yaw measurement of said stage by use of an X reflection surface provided on said stage along the Y direction, wherein said X measuring device includes (i) an X-direction interferometer for measuring a position of said stage in the X direction and (ii) an X yaw interferometer being cooperable with said X-direction interferometer to measure yawing of said stage.

9. An apparatus according to claim 8, wherein said X-direction interferometer and said X yaw interferometer are arranged to use a light beam reflected by said X reflection surface, and said Y-direction interferometer and said Y yaw interferometer are arranged to use a light beam reflected by said Y reflection surface.

10. A device manufacturing method including:
    a step of transferring a pattern onto a substrate by use of a scan type exposure apparatus that comprises (i) a stage for moving the substrate in a Y direction corresponding to a scan direction, and in an X direction intersecting the scan direction, (ii) an alignment scope for performing measurement for alignment of the substrate, at a position spaced, in the Y direction, from a position where the exposure of the substrate is to be carried out, the alignment scope being disposed on a straight line parallel to a Y-axis and passing through the position for exposure of the substrate, (iii) an X measuring device for performing yaw measurement of the stage by use of an X reflection surface provided on the stage along the Y direction, (iv) a Y measuring device for performing yaw measurement of the stage by use of a Y reflection surface provided on the stage along the X direction, and (v) a controller which selects yaw measurement information of the measuring device for an alignment operation including the alignment measurement using the alignment scope, and which selects yaw measurement information for the Y measuring device for the scan exposure.

* * * * *

UNITED STATES PATENT AND TRADEMARK OFFICE
CERTIFICATE OF CORRECTION

PATENT NO. : 6,856,404 B2
DATED : February 15, 2005
INVENTOR(S) : Kazunori Iwamoto et al.

It is certified that error appears in the above-identified patent and that said Letters Patent is hereby corrected as shown below:

<u>Title page,</u>
Item [*] Notice, insert the following paragraph:
-- This patent issued on a continued prosecution application filed under 37 CFR 1.53(d), and is subject to the twenty year patent term provisions of 35 U.S.C. 154(a)(2). --

<u>Column 6,</u>
Line 46, "the" should read -- type --.

Signed and Sealed this

Nineteenth Day of July, 2005

JON W. DUDAS
*Director of the United States Patent and Trademark Office*